(12) United States Patent
Best et al.

(10) Patent No.: US 7,019,814 B2
(45) Date of Patent: Mar. 28, 2006

(54) LITHOGRAPHIC PROJECTION MASK, DEVICE MANUFACTURING METHOD, AND DEVICE MANUFACTURED THEREBY

(75) Inventors: Keith Frank Best, Prunedale, CA (US); Joseph J. Consolini, Costa Mesa, CA (US); Alexander Friz, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/738,977

(22) Filed: Dec. 19, 2003

(65) Prior Publication Data

US 2004/0156027 A1    Aug. 12, 2004

(30) Foreign Application Priority Data

Dec. 19, 2002   (EP)   .................................. 02258762

(51) Int. Cl.
*G03B 27/42* (2006.01)
*G03B 27/52* (2006.01)

(52) U.S. Cl. .......................................... 355/53; 355/55
(58) Field of Classification Search ................. 355/53, 355/67, 77; 430/5, 20, 22; 356/399–401; 250/548
See application file for complete search history.

(56) References Cited

U.S. PATENT DOCUMENTS 4,355,892 A * 10/1982 Mayer et al. ................. 355/77

4,657,379 A    4/1987 Suwa
4,748,478 A * 5/1988 Suwa et al. ................... 355/53

(Continued)

FOREIGN PATENT DOCUMENTS

| EP | 0 466 335 A2 | 1/1992 |
|---|---|---|
| EP | 0 466 335 A3 | 3/1993 |
| JP | 11-219878 | 8/1999 |
| JP | 2002-134397 | 5/2002 |
| WO | WO 98/33096 | 7/1998 |
| WO | WO 98/38597 | 9/1998 |
| WO | WO 98/40791 | 9/1998 |

OTHER PUBLICATIONS

Peter von Zant, "Microchip Fabrication: A Practical Guide to Semiconductor Processing", Third Edition, McGraw Hill Publishing, 1997, ISBN 0-07-067250-4 (copy not included).

(Continued)

*Primary Examiner*—Henry Hung Nguyen
(74) *Attorney, Agent, or Firm*—Pillsbury Winthrop Shaw Pittman, LLP

(57) ABSTRACT

A method according to one embodiment of the invention may be used in determining relative positions of developed patterns on a substrate (exposed e.g. using the step mode). Such a method uses reference marks which are located within or even superimposed on device patterns. Also disclosed is a mask of a lithographic projection apparatus including reference marks that may be used in such a method.

25 Claims, 4 Drawing Sheets

U.S. PATENT DOCUMENTS

| | | |
|---|---|---|
| 5,229,872 A | 7/1993 | Mumola |
| 5,296,891 A | 3/1994 | Vogt et al. |
| 5,298,761 A * | 3/1994 | Aoki et al. .................. 250/548 |
| 5,440,138 A * | 8/1995 | Nishi ........................ 250/548 |
| 5,523,193 A | 6/1996 | Nelson |
| 5,715,063 A | 2/1998 | Ota |
| 5,969,441 A | 10/1999 | Loopstra et al. |
| 5,981,116 A * | 11/1999 | Ota ............................. 430/22 |
| 6,118,517 A * | 9/2000 | Sasaki et al. ................. 355/53 |
| 6,128,070 A * | 10/2000 | Peng ........................... 355/53 |
| 6,163,366 A * | 12/2000 | Okamoto et al. ............. 355/53 |

OTHER PUBLICATIONS

Korean Office Action for Application No. 10-2003-0092892 dated Aug. 31, 2005, along with an English translation.

* cited by examiner

LITHOGRAPHIC PROJECTION MASK, DEVICE MANUFACTURING METHOD, AND DEVICE MANUFACTURED THEREBY

RELATED APPLICATIONS

This application claims priority to European Patent Application EP 02258762.0, filed Dec. 19, 2002, which document is herein incorporated by reference.

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

It is desirable to enable accurate alignment of patterns exposed onto adjacent or overlapping target portions. For example, it may be desired to obtain accurate alignment of patterns exposed onto target portions that do not overlap.

SUMMARY

A device manufacturing method according to one embodiment of the invention includes projecting an image onto a first target portion of a radiation-sensitive material that at least partially covers a substrate, where the image includes a device pattern and at least one reference mark located within the device pattern. The method also includes projecting the image onto a second target portion of the radiation-sensitive material, and determining a relative placement of the first and second target portions based on a relative position of the reference marks in the first and second target portions. Masks including reference marks, processors configured to control such methods, and data storage media including instructions describing such methods are also disclosed herein.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods of determining relative placement of a plurality of patterns developed on a substrate.

Figure 1:
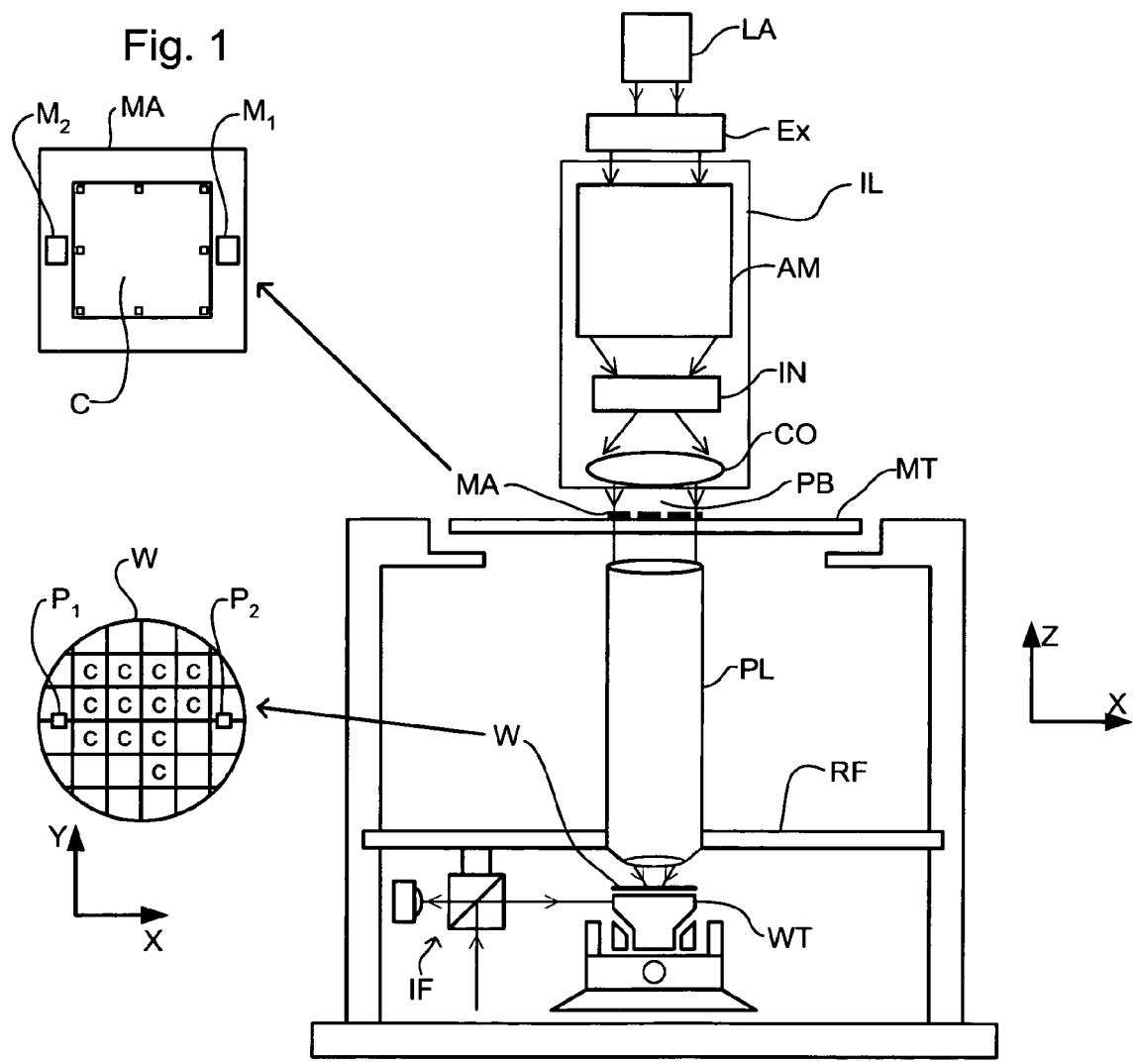
FIG. 1 depicts a lithographic projection apparatus according to an embodiment of the invention.

FIG. 1 schematically depicts a lithographic projection apparatus according to a particular embodiment of the invention in conjunction with which an embodiment of the current invention can be employed. The apparatus comprises:

A radiation system configured to supply (e.g. having structure capable of supplying) a projection beam of radiation. In this particular example, the radiation system Ex, IL, for supplying a projection beam PB of radiation (e.g. UV or EUV radiation) also comprises a radiation source LA;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

Generally the radiation beam in a lithography apparatus is only large enough to expose small parts of the wafer at a time. Two methods may be used to overcome this so that the whole of the wafer may be exposed. The first is the so-called scan mode, in which the mask and substrate may be moved simultaneously so that a large portion of the substrate can be exposed. The second is step mode, in which an entire mask image may be projected at one time onto a target portion of the substrate, and the substrate is then shifted so that a different portion can then be exposed to the radiation beam.

The portions exposed on the substrate table can either be partially overlapping or be abutting. In both overlapping and abutting cases, it is clearly desirable to have the portions as well aligned as possible, e.g. to maximize use of space on the substrate and therefore maximize throughput. Some devices being manufactured cover several target portions, and alignment of these target portions may become critical to ensure correct functioning of the device. In such a case, the same or different masks may be used for adjacent target portions.

Box-in-box or similar metrologies may rely on a particular relative placement of 2 concentric boxes or similar features (sized e.g. between 5 microns and 100 microns) to determine registration errors. Such determination may be made by measuring the relative positions of the said features printed during different process operations. Similarly, such a method can be used to measure relative placement/registration errors of adjacent dies or fields, e.g. by overlapping them such that the necessary features have the correct relative placement that is needed for the measurement.

Potential disadvantages of such a method include an inability to quantify true field butting or stitching, as it may be necessary to overlap the fields, and the region of interest may be different than the region that is being used for the metrology. In other words, the area where the metrology features are placed in the overlap region may not be where the device is actually being stitched.

Some embodiments of the invention may be used to particular advantage with a step mode in which a plurality of target portions C on the substrate W are exposed in sequence. The target portions may be aligned so that they either abut or so that they overlap by small amounts (so called pattern stitching), e.g. in order to maximize the surface area used on the substrate and therefore the efficiency of the process. For example, such a process may only be effective if the target portions C are accurately positioned relative to one another. Embodiments of the invention include a method of determining the alignments of neighboring target portions so that the step mode can be improved or optimized.

In a method according to one embodiment of the present invention, the mask MA has a device pattern DP on it (see FIG. 2, in which the details of the device are not illustrated) which is intended to be projected onto the target portions C of the substrate W. The device pattern DP of the mask MA comprises at least one reference mark 5 which is projected but which does not form a working part of the final manufactured device. The reference mark 5 is used to determine the relative placement of target portions C as described below. The reference mark 5 may be within the device pattern; that is, parts of the device pattern of the mask may completely surround the reference mark on all sides of the reference mark 5, such that the reference mark 5 is not merely at the edge of the device pattern.

Figure 2:
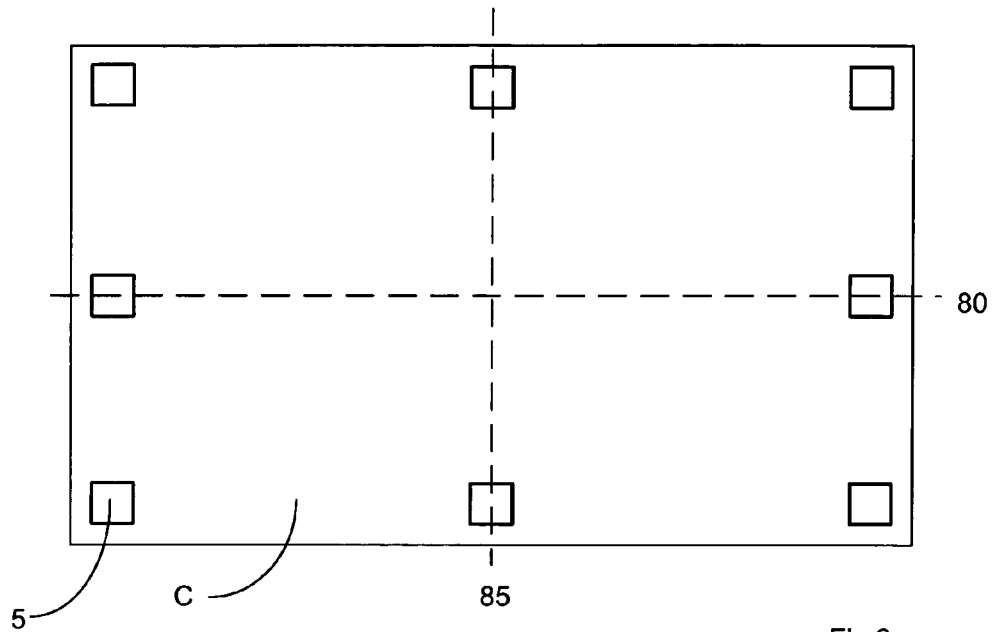
FIG. 2 depicts a lithographic device pattern of a mask according to an embodiment of the present invention.
Figure 3:
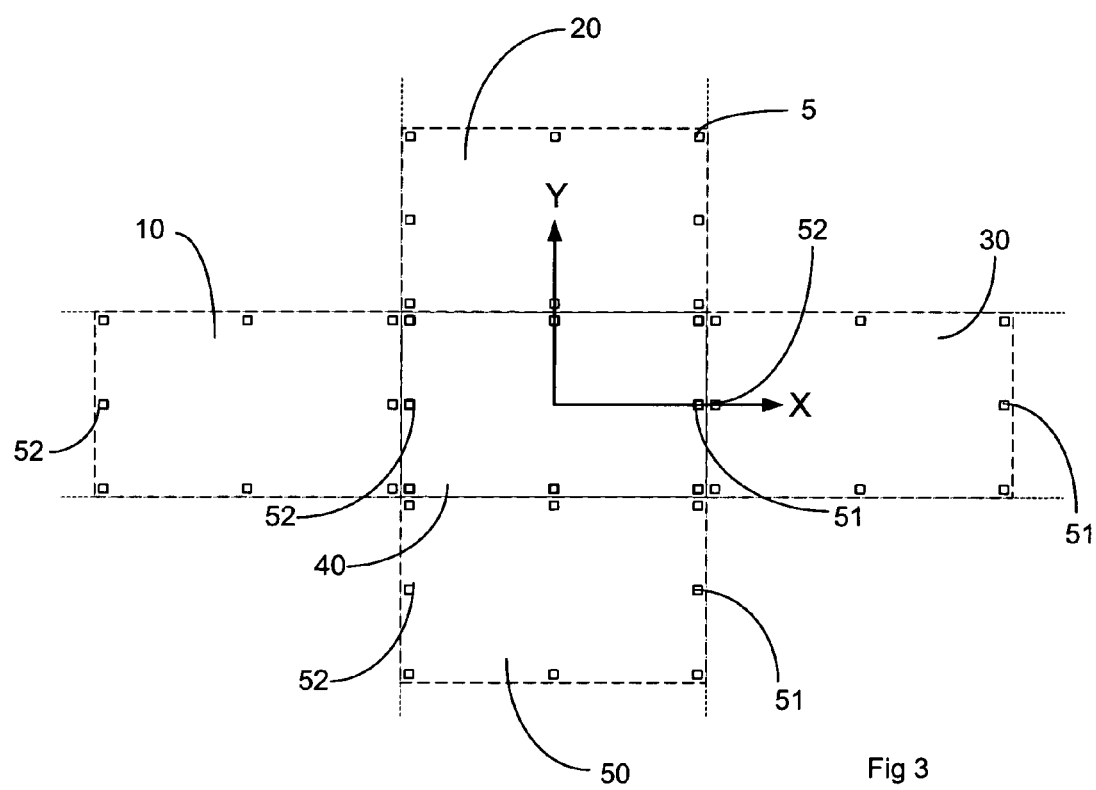
FIG. 3 depicts a plurality of developed patterns on a substrate surface.

As can be seen in FIG. 3, exposing a substrate W by a step mode may include first projecting a plurality of patterns (e.g. corresponding to the device pattern DP of the mask MA shown in FIG. 2) onto a target portion C of a radiation-sensitive material on a surface of the substrate, which may then be developed to form a plurality of developed patterns 10, 20, 30, 40, 50. These patterns 10, 20, 30, 40, 50 may either abut as illustrated or may overlap slightly as described above. A relative alignment of the patterns in the XY directions in the plane of the surface of the substrate can be determined by measuring alignment of the at least one reference mark 5, 51, 52 of respective developed patterns 10, 20, 30, 40, 50.

The adjacent development patterns 10, 20, 30, 40, 50 need not be of the same type, especially if a single device to be manufactured extends over several target portions. In such case, different masks having different device patterns DP may be used, but it ma be desirable for adjacent device patterns to include compatibly placed alignment marks 5. The alignment marks 5 may be completely within the development patterns 10, 20, 30, 40, 50.

Figure 4:
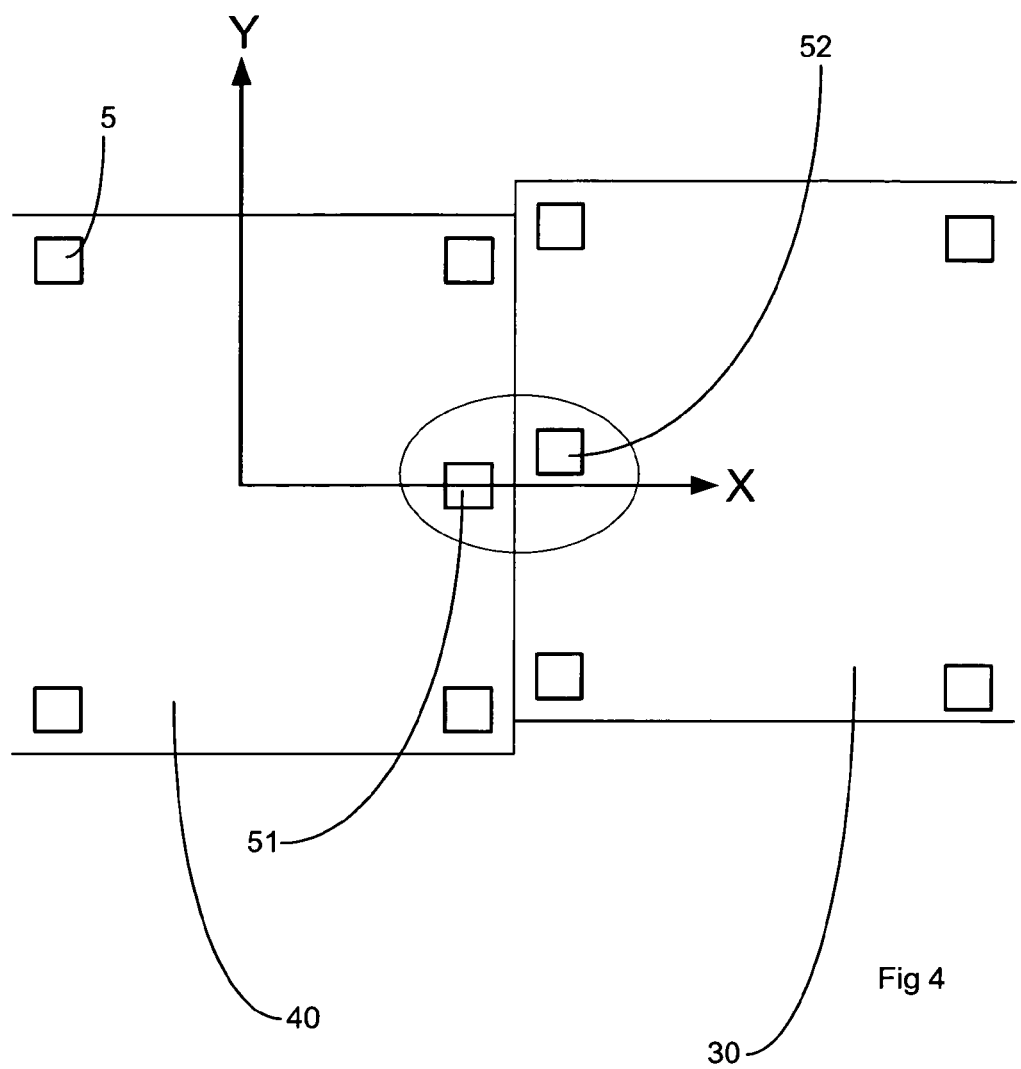
FIG. 4 illustrates measurement of misalignment of adjacent patterns on a substrate surface.

FIG. 4 shows in detail a measurement of misalignment of two adjacent developed patterns 30, 40 by determination of the relative positions of reference marks 51 and 52. Such measurement may be carried out before or after development of the pattern. By determining an offset between adjacent developed patterns 30, 40, an error in positioning of the substrate table during the step mode can be calculated, and the process for manufacturing the following substrate, especially the movement of the substrate W during stepping, can be improved or optimized on this information.

Such a method can be used as a quality control method when the device to be manufactured extends across several target portions. In such case, if a degree of misalignment is detected which may result in a defective device, the layer of exposed radiation-sensitive material can be removed and the process for that layer can be carried out again. In this way, the effort expended in previously deposited layers need not be discarded, and no effort need be expended in subsequent layers when the device might in any case not function due to the misalignment.

As will be appreciated, determination of relative placement of adjacent developed patterns 30, 40 may be most accurately achieved if the at least one reference mark 5, 51, 52 of adjacent developed patterns are positioned close to one another. Such positioning may be achieved by having at least one of the at least one reference mark 5, 51, 52 associated with each of one or more (possibly all) of the edges of the device pattern DP which will, once projected and developed, abut against another edge of the device pattern DP. Such a result may be achieved by providing the device pattern DP with at least two axes of symmetry as regards the reference mark 5. Such an arrangement is illustrated in FIG. 2, where it can be seen that at least two such axes 80, 85 exist. If the device pattern DP is rectangular, it may be convenient to position a reference mark 5 midway along each edge and spaced away from the edge, though the mark may be positioned anywhere. Of course, it may be desirable to position the reference mark 5 in an area of the device pattern DP that contains no actual device details.

Figure 5:
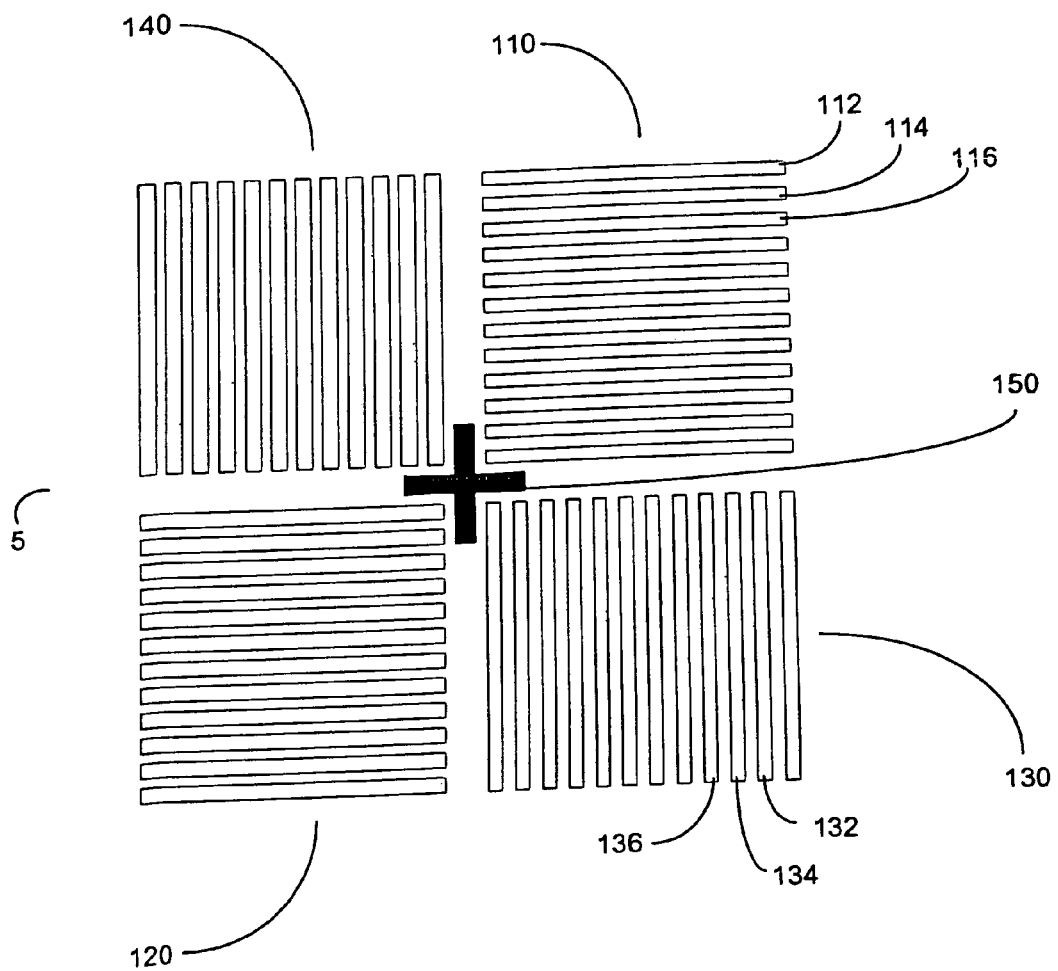
FIG. 5 illustrates a reference mark according to an embodiment of the present invention.

A lithographic projection machine may already comprise one or more alignment sensors for precise positioning of various devices such as the mask MA using positioning marks M1, M2 and the substrate W using alignment marks P1, P2. These alignment systems may be based on optical diffraction methods using diffraction gratings. FIG. 5 shows a reference mark 5 which may be used in the device pattern DP according to an embodiment of the present invention. Existing alignment systems in a lithographic projection apparatus can use such marks 5 to measure relative displacement of developed patterns 10, 20, 30, 40, 50. This pattern of alignment mark is known, and it has been explained in detail in WO 98/39689 (which document is herein incorporated by reference, and which document also explains on-axis and off-axis alignment using such marks).

FIG. 5 illustrates a substrate alignment mark 5 according to one embodiment of the invention. Such an alignment mark 5 may include four sub-gratings 110, 120, 130 and 140, of which the sub-gratings 130 and 140 serve for alignment in the X direction and the sub-gratings 110 and 120 serve for alignment in the Y direction. Sub-grating 110 may include periodic structures 112, 114, 116. Sub-grating 130 may include periodic structures 132, 134, 136. Mark 150 may be placed at the center of the various sub-gratings 110, 120, 130 and 140.

A device pattern according to an embodiment of the invention has at least one reference mark within it, and a method according to an embodiment of the invention includes determining relative placement of two of a plurality of target portions by measuring alignment of the at least one reference mark of the two target portions. Such a method may be used to measure alignment of abutted device patterns. As a consequence, the accuracy of the placement error can be more accurately assessed. Also, at least some such embodiments may be used with overlapping device patterns.

A system according to an embodiment of the invention may have the advantage that the determining can be carried out in an existing lithographic projection apparatus which generally already comprises alignment systems to measure alignments of other components in the lithographic projection apparatus. Thus, the degree of alignment and necessary correction can be measured directly in the lithographic projection apparatus, and the results can be fed back such that the next wafer is stepped differently to account for the measured misalignment and so that the efficiency with which corrections are made is increased. If the device to be manufactured extends over several target portions, a method according to an embodiment of the invention may be used to act as a quality control operation e.g. to ensure that the device will function correctly. If misalignment is detected, the resist may be removed and the process carried out again until the correct alignment is achieved.

A lithographic projection mask according to an embodiment of the invention may be used to endow a beam of radiation with a pattern. Such a mask may include a device pattern that has at least one reference mark within it.

A device manufacturing method according to an embodiment of the invention includes providing a substrate that is at least partly covered by a layer of radiation-sensitive material; providing a projection beam of radiation using a radiation system; providing at least one patterning structure including a device pattern; using said at least one patterning structure to endow the projection beam with said device pattern; and projecting the patterned beam of radiation onto a plurality of target portions of the layer of radiation-sensitive material. Embodiments of the present invention also include a device manufactured by such a method and a lithographic projection mask configured to endow a beam of radiation with a device pattern.

Whilst specific embodiments of the invention have been described above, it will be appreciated that the invention as claimed may be practiced otherwise than as described. For example, embodiments of the method may also include one or more computers, processors, and/or processing units (e.g. arrays of logic elements) configured to control an apparatus to perform a method as described herein, or a data storage medium (e.g. a magnetic or optical disk or semiconductor memory such as ROM, RAM, or flash RAM) configured to include instructions describing such a method. It is explicitly noted that the description of these embodiments is not intended to limit the invention as claimed.

We claim:

1. A device manufacturing method comprising:
   projecting a first image onto a first target portion of a radiation-sensitive material that at least partially covers a substrate, the first image including a first device pattern and at least a first reference mark located within the first device pattern;
   projecting a second image, including a second device pattern and at least a second reference mark, onto a second target portion of the radiation-sensitive material; and
   determining a relative placement of the first image and the second image based on a relative position of the first reference mark and the second reference mark, wherein the first reference mark and the second reference mark are not superposed, and wherein the first image and the second image include two reference marks positioned along a line that bisects the corresponding device pattern.

2. The device manufacturing method according to claim 1, wherein the first device pattern and the second device pattern extend around corresponding reference marks.

3. The device manufacturing method according to claim 1, wherein the first device pattern and the second device pattern include a same device pattern.

4. The device manufacturing method according to claim 1, wherein said projecting includes using a patterning structure to pattern a beam of radiation according to the corresponding device pattern.

5. The device manufacturing method according to claim 1, wherein the first image and the second image include two reference marks positioned along a first line that bisects the corresponding device pattern, and
   wherein the first image and the second image include two reference marks positioned along a second line that bisects the corresponding device pattern and wherein the second line has a different direction than the first line.

6. The device manufacturing method according to claim 1, said method further comprising developing the radiation-sensitive material to form a plurality of developed patterns on the substrate that corresponding to respective images.

7. The device manufacturing method according to claim 6, said method further comprising determining that the developed patterns are misaligned, based on the relative placement of the respective images; and
   removing an exposed portion and an unexposed portion of the layer of radiation-sensitive material, based on said determining that the developed patterns are misaligned.

8. The device manufacturing method according to claim 1, said method further comprising determining that the first image and the second image are misaligned, based on the relative placement; and
   removing an exposed portion and an unexposed portion of the layer of radiation-sensitive material, based on said determining that the first image and the second image are misaligned.

9. The device manufacturing method according to claim 1, further comprising projecting a third image onto a third target portion of the radiation-sensitive material, said projecting the third image onto the third target portion being based on a result of said determining the relative placement of the first image and the second image.

10. A device manufacturing method comprising:
    projecting a first image onto a first target portion of a radiation-sensitive material that at least partially covers a substrate, the first image including a first device pattern and at least a first reference mark located within the first device pattern;

projecting a second image, including a second device pattern and at least a second reference mark, onto a second target portion of the radiation-sensitive material; and determining a relative placement of the first image and the second image based on a relative position of the first reference mark and the second reference mark, wherein the first reference mark and the second reference mark are not superposed wherein said projecting the second image onto the second target portion of the radiation-sensitive material includes projecting the second image onto a plurality of target portions of the radiation-sensitive material, each of the plurality of target portions being adjacent to the first target portion, wherein the first target portion includes a plurality of regions, each of the plurality of regions corresponding to one of the plurality of adjacent target portions and being adjacent to the corresponding target portion, and wherein each of the plurality of regions includes at least the first reference mark.

11. The device manufacturing method according to claim 10, wherein at least one of the plurality of adjacent target portions at least partially overlaps the corresponding region.

12. A data storage medium including instructions describing a device manufacturing method, said method comprising:

projecting a first image onto a first target portion of a radiation-sensitive material that at least partially covers a substrate, the first image including a first device pattern and at least a first reference mark located within the first device pattern;

projecting a second image, including a second device pattern and at least a second reference mark, onto a second target portion of the radiation-sensitive material; and determining a relative placement of the first image and the second image based on a relative position of the first reference mark and the second reference mark, wherein the first reference mark and the second reference mark are not superposed, wherein said projecting the second image onto the second target portion of the radiation-sensitive material includes projecting the second image onto a plurality of target portions of the radiation-sensitive material, each of the plurality of target portions being adjacent to the first target portion, wherein the first target portion includes a plurality of regions, each of the plurality of regions corresponding to one of the plurality of adjacent target portions and being adjacent to adjacent to the corresponding target portion, and wherein each of the plurality of regions includes at least the first reference mark.

13. The data storage medium according to claim 12, wherein said projecting includes using a patterning structure to pattern a beam of radiation according to the corresponding device pattern.

14. The data storage medium according to claim 12, said method further comprising developing the radiation-sensitive material to form a plurality of developed patterns on the substrate that correspond to respective images.

15. The data storage medium according to claim 14, said method further comprising determining that the developed patterns are misaligned, based on the relative placement of the respective images; and removing an exposed portion and an unexposed portion of the layer of radiation-sensitive material, based on said determining that the developed patterns are misaligned.

16. The data storage medium according to claim 12, said method further comprising determining that the first image and the second image are misaligned, based on the relative placement; and removing an exposed portion and an unexposed portion of the layer of radiation-sensitive material, based on said determining that the first image and the second image are misaligned.

17. The data storage medium according to claim 12, further comprising projecting a third image onto a third target portion of the radiation-sensitive material, said projecting the third image onto the third target portion being based on a result of said determining a relative placement of the first image and the second image.

18. The data storage medium according to claim 12, wherein at least one of the plurality of adjacent target portions at least partially overlaps the corresponding region.

19. A device manufacturing method comprising:

projecting a first image onto a first target portion of a radiation-sensitive material that at least partially covers a substrate, the first image including at least a first reference mark;

projecting a second image onto a second target portion of the radiation-sensitive material, wherein the second image includes at least a second reference mark; and determining a relative placement of the first image and the second image based on a relative position of the first reference mark in the first target portion and the second reference mark in the second target portion, wherein the two reference marks do not overlap one another, wherein said projecting the second image onto the second target portion of the radiation-sensitive material includes projecting the second image onto a plurality of target portions of the radiation-sensitive material, each of the plurality of target portions being adjacent to the first target portion, wherein the first target portion includes a plurality of regions, each of the plurality of regions corresponding to one of the plurality of adjacent target portions and being adjacent to the corresponding target portion, and wherein each of the plurality of regions includes at least the first reference mark.

20. The device manufacturing method according to claim 19, wherein said projecting includes using a patterning structure to pattern a beam of radiation according to the corresponding device pattern.

21. The device manufacturing method according to claim 19, said method further comprising developing the radiation-sensitive material to form a plurality of developed patterns on the substrate that correspond to respective images.

22. The device manufacturing method according to claim 21, said method further comprising determining that the developed patterns are misaligned, based on the relative placement of the respective images; and removing an exposed portion and an unexposed portion of the layer of radiation-sensitive material, based on said determining that the developed patterns are misaligned.

23. The device manufacturing method according to claim 19, said method further comprising determining that the first image and the second image are misaligned, based on the relative placement; and removing an exposed portion and an unexposed portion of the layer of radiation-sensitive material, based on said determining that the first image and the second image are misaligned.

24. The device manufacturing method according to claim 19, further comprising projecting a third image onto a third target portion of the radiation-sensitive material, said projecting the third image onto the third target portion being based on a result of said determining the relative placement of the first image and the second image.

25. The device manufacturing method according to claim 19, wherein at least one of the plurality of adjacent target portions at least partially overlaps the corresponding region.

* * * * *